(12) United States Patent
Sinha et al.

(10) Patent No.: US 7,793,178 B2
(45) Date of Patent: Sep. 7, 2010

(54) CELL SUPPORTING SCAN-BASED TESTS AND WITH REDUCED TIME DELAY IN FUNCTIONAL MODE

(75) Inventors: Sanchayan Sinha, Bangalore (IN); Dharin N Shah, Bangalore (IN); Achin Grover, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 350 days.

(21) Appl. No.: 11/309,191

(22) Filed: Jul. 12, 2006

(65) Prior Publication Data

US 2008/0016417 A1 Jan. 17, 2008

(51) Int. Cl.
*G01R 31/28* (2006.01)
(52) U.S. Cl. .................... 714/726; 714/731
(58) Field of Classification Search .......... 714/724–731
See application file for complete search history.

(56) References Cited

U.S. PATENT DOCUMENTS 4,481,430 A * 11/1984 Houk et al. ............. 327/540
4,495,629 A * 1/1985 Zasio et al. .............. 377/70
4,782,283 A * 11/1988 Zasio ...................... 714/726
5,717,700 A * 2/1998 Crouch et al. ............ 714/726

OTHER PUBLICATIONS

US Patent Application entitled, "Digital Storage Element Architecture Comprising Dual Scan Clocks and Gated Scan Output", U.S. Appl. No. 11/171,537, filed Jun. 30, 2005, naming as inventors: Sinha et al (30 Pages of Specification and 18 Sheets of Drawing).

* cited by examiner

*Primary Examiner*—Kevin L Ellis
*Assistant Examiner*—Steve Nguyen
(74) *Attorney, Agent, or Firm*—Dawn V. Stephens; Wade James Brady, III; Frederick J. Telecky, Jr.

(57) ABSTRACT

A memory cell supporting scan-based tests and with reduced time delay in functional mode. The memory cell generates separate clocks for latching functional and scan data into a storage element contained in the memory cell. The use of separate clock signals permits transmission of scan data and functional data via separate paths, thereby eliminating additional circuitry that are otherwise needed to multiplex such scan and functional data through a same path. The absence of such additional circuitry reduces the time delays from input to output. The structure of the memory cell provided also permits easy addition of logic functions without substantially affecting operating speeds.

4 Claims, 12 Drawing Sheets

CELL SUPPORTING SCAN-BASED TESTS AND WITH REDUCED TIME DELAY IN FUNCTIONAL MODE

BACKGROUND

1. Field of the Invention

The present invention relates generally to design of electronic circuits, and more specifically to a scannable memory cell used in integrated circuit design.

2. Related Art

A scan based test generally refers to an approach in which storage elements of an integrated circuit are connected as a scan chain, a scan vector is scanned in through the scan chain, the integrated circuit is placed in an evaluation mode for one or more clock cycles, and the values stored due to evaluation are compared with an expected output to determine whether the integrated circuit is operating as desired or not.

On the other hand, functional mode refers to the normal operation mode of an integrated circuit, providing the general utility the circuit is designed for.

To support both the scan based tests and the functional mode of operations, additional circuitry is often provided associated with each storage element (sought to be part of a scan chain and the functional mode of operation). The additional circuitry enables the bits of the scan vector to be received and stored in the storage element during the scan operations, and the bits from a portion of the integrated circuit during functional mode operations according to (or determined by) the topology/connectivity with which the integrated circuit is designed.

The storage element along with the additional circuitry provided associated with the storage element, may together be referred to as a memory cell.

There are several situations in which it is desirable that the memory cells operate with low delay in functional mode. For example, if a memory cell is in the critical path of a circuit, it may be desirable to reduce in the delay of the memory cell in the functional mode. Various aspects of the present invention provide for such a memory cell as described below in further detail.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

According to an aspect of the present invention, the data bits on a functional input are designed to be received and stored in a storage element when a first clock signal is operative, and the data bits on a scan input are designed to be received and stored in the storage element when a second clock signal is operative. A clock generation circuit is designed to generate the operative first clock signal in functional mode and the operative second clock signal in scan mode.

Thus, the scan data is stored in the storage element only in the scan mode and the functional data in the functional mode, thereby operating as a memory cell suitable for scan tests.

The use of separate clock signals permits transmission of scan data and functional data via separate paths, thereby eliminating additional circuitry that are otherwise needed to multiplex such scan and functional data through a same path according to one prior approach. The absence of multiplexing circuitry reduces delays during operation in the functional mode.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

The features of the invention will be clearer in comparison with a prior embodiment (operating in an example environment) which does not implement at least some features of the invention. Accordingly, descriptions of the example environment and a prior embodiment are provided first.

2. Example Environment

Figure 1A:
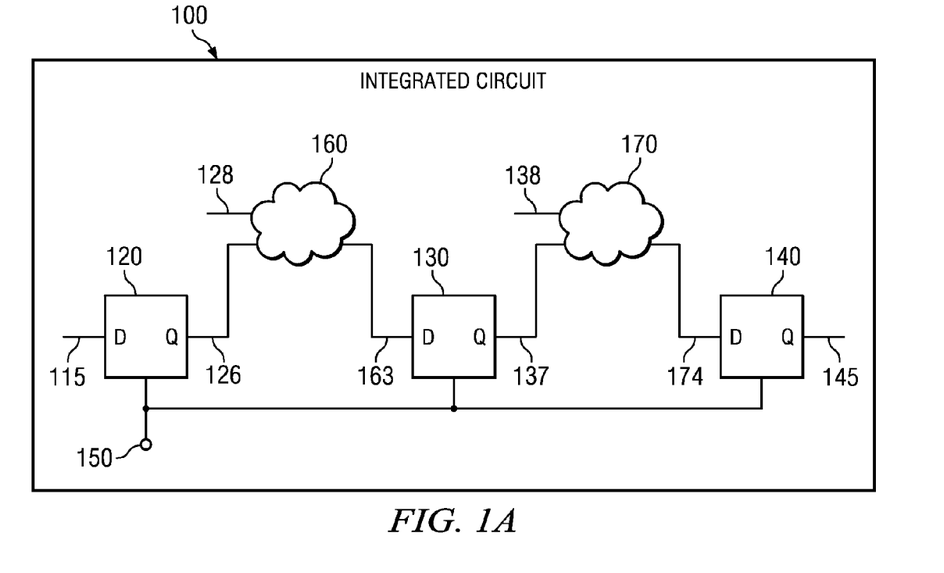
FIG. 1A is a block diagram of an example portion of an integrated circuit in which various aspects of the present invention may be implemented.

FIG. 1A is a block diagram of a an example environment in which various aspects of the present invention may be implemented. The diagram shows a portion of an integrated circuit (IC) 100. The various components shown are described below.

Memory cell (element) 120 stores an input logic signal received on path 115 in response to a clock signal 150, and provides the stored logic value on path 126. Similarly, memory cells 130 and 140 store (in response to clock signal 150) logic signals received on paths 163 and 174 respectively, and provide the respective stored logic values on paths 137 and 145. Clock signal 150 may be provided by circuitry (not shown) contained in IC 100 or supplied external to IC 100.

Memory cells 120, 130 and 140 may be implemented as flip-flops.

Combinational logic 160 performs combinational logic operations (such as AND, OR, invert etc) on logic signals received on paths 126 and 128, and provides an output on path 163.

Similarly, combinational logic 170 performs combinational logic operations (such as AND, OR, invert etc) on logic signals received on paths 137 and 138, and provides an output on path 174.

Figure 1B:
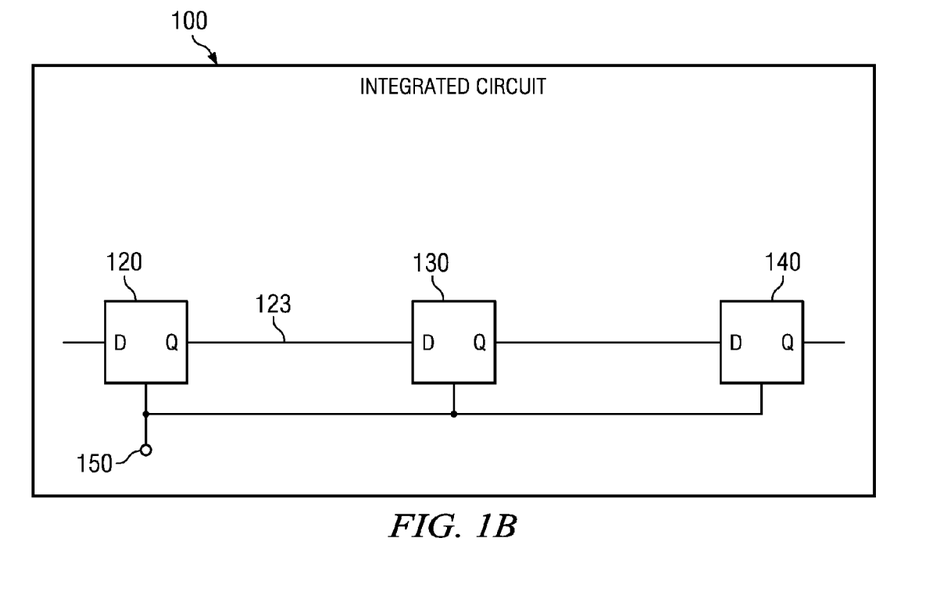
FIG. 1B is a block diagram showing the configuration of the example portion during scan operations.

In environments such as the one shown in FIG. 1, components such as memory cells 120, 130 and 140 are tested to verify proper operation. During such tests (referred to as scan tests), inputs are generally provided from an external test equipment to memory cells. The operation of each memory cell in the scan mode is logically illustrated with respect to FIG. 1B.

FIG. 1B is a block diagram depicting memory cells 120, 130 and 140 connected as a scan chain. The output of memory cell 120 is shown connected to the input of memory cell 130 via path 123. Similarly, the output of memory cell 130 is connected to the input of memory cell 140. The bits of a scan vector are scanned in sequentially into the scan chain, the circuit is again placed in the configuration of FIG. 1A for evaluation, and the resulting bits stored in the memory cells 120, 130 and 140 are read out sequentially according to the configuration of FIG. 1B in a scan out phase. The bits read out forms an output vector, which is compared with an expected vector to determine the presence of any faults in the operation of the integrated circuit 100.

Thus, it may be appreciated from FIGS. 1A and 1B that each memory cell needs to be designed to receive and store inputs from either a previous component in the scan chain in case of test mode (FIG. 1B) or from a component as determined by the functional configuration in functional mode. The description is continued with respect to a prior memory cell which is designed for such an operation.

3. Prior Memory Cell

Figure 2:
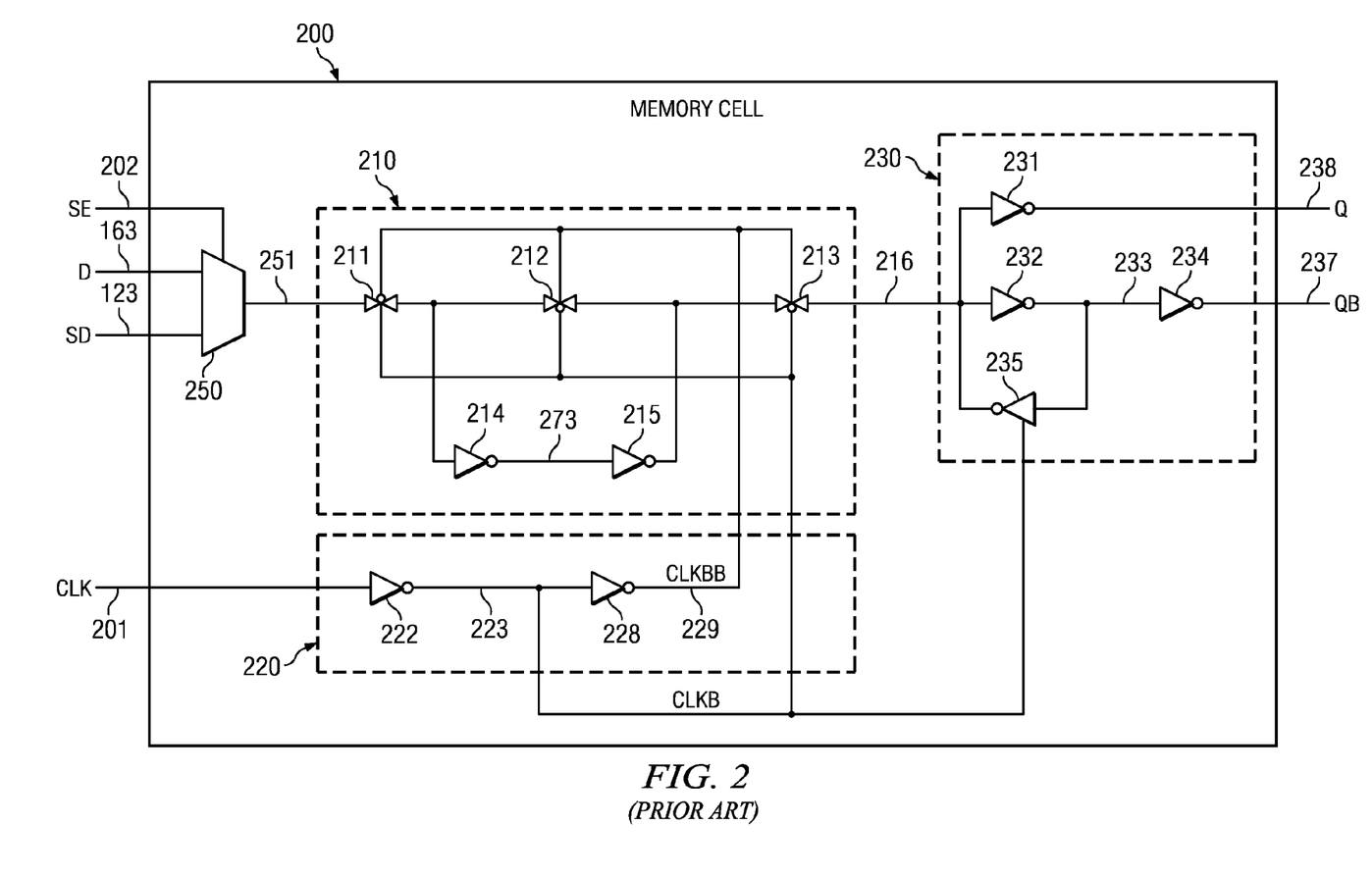
FIG. 2 is a block diagram illustrating the details of a prior embodiment of a memory cell.

FIG. 2 is a block diagram of a prior embodiment of a memory cell that may be used in the example environment described above. Memory cell 200 is shown containing multiplexer (MUX) 250, master latch 210, slave latch 230 and clock circuit 220. For illustration, the memory cell 200 is described as being used in the place of memory cell 130 of FIG. 1. Each component is described in further detail below.

MUX 250 receives a functional data D on path 163, and a scan data SD on path 123, and forwards one of the two signals on path 251 based on a scan enable (SE) signal received on path 202. Logic signal (functional data) D is valid during normal (functional and evaluation mode) operation and scan data SD is received during the scan operations. SE is activated during the scan operations and causes MUX 250 to forward SD on path 251, while during functional/evaluation modes of operation SE is inactive and causes MUX 250 to forward D on path 251.

Clock circuit 220 contains inverters 222 and 228. Inverter 222 receives a clock input CLK on path 201 and provides an inverted and buffered clock signal CLKB on path 223. Inverter 228 provides on path 229 an inverted and buffered version (CLKBB) of signal CLKB received on path 223.

Master latch 210 contains inverters 214 and 215, and passgates 211, 212 and 213. Slave latch 230 contains inverters 231, 232, 234 and tri-state inverter 235. When CLKB is at logic 1, tri-state inverter 235 provides on path 216 an inverted value of the signal present on path 233. When CLKB is a logic 0, the output on path 216 of tri-state inverter 235 is in a high-impedance state. The operation of memory cell 200 is briefly described below.

When CLK is at logic 0, CLKB is at logic 1, CLKBB is at logic 0, pass gate 211 is ON and pass gates 212 and 213 are OFF. Tri-state inverter 235 is ON and slave latch 230 outputs Q(238) and QB (237) as previously stored by the combination of inverters 232 and 235

When CLK transitions from logic 0 to logic 1 there is a brief interval when passgates 211, 212 and 213 are ON. After a delay equal to the propagation delay of inverter 228, passgate 211 turns OFF while passgates 212 and 213 remain ON, and the input signal on path 251 is stored in master latch 210 by the combination of inverters 214 and 215. Thus, the input signal on path 251 is stored(latched) by master latch 210 and is available on path 216.

When CLK transitions to (and remains at) logic 1, CLKB is a logic 0, tri-state inverter 235 is disabled(tri-stated), and the output 216 of master latch 210 is provided at outputs 238 (Q) and 237 (QB) through inverters 231 and 232/234 respectively. As may be verified, when CLK transitions to a logic 0, passgates 212 and 213 turn OFF thus tri-stating the output of passgate 213 on path 216. However, since CLKB becomes a logic 1, tri-state inverter 235 is ON, and the combination of inverters 232/235 effectively latches the output on 216. It may be noted that tri-state inverter 235 turns ON before the output of passgate 213 is tri-stated, thereby ensuring that the signal on path 216 is reliably latched.

As may be further seen, the storing of an input (either signal D or scan test signal SD) occurs at the positive edge of memory cell 200. Signal SE may be provided to select either D or SD for storage.

The use of MUX 250 to select either a functional data signal (D) or a scan test signal SD may cause an additional delay in the data path from input (D or SD) to output (Q/QB). This may not be desirable especially with respect to functional data D, as this may introduce unacceptable overall delays in the operation of circuits that employ such memory cells, especially when such memory cells are in the critical path of the circuit/signal.

Various aspects of the present invention provide a memory cell with reduced time delay in functional mode and also supports scan-based tests, as described below.

4. Memory Cell

Figure 3A:
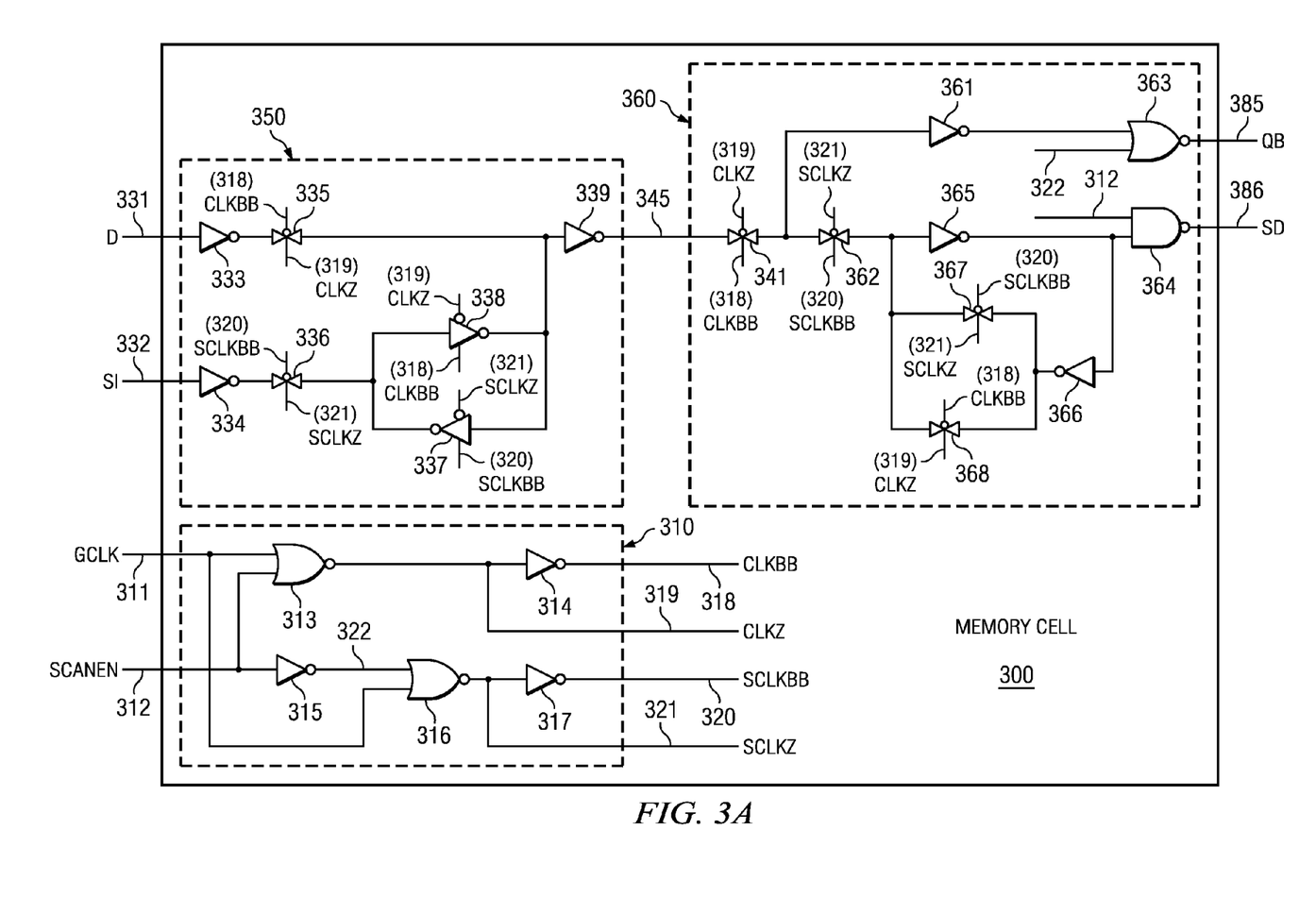
FIG. 3A is a circuit diagram illustrating the details of a memory cell in one embodiment of the present invention.

FIG. 3A is a diagram of a memory cell 300 in one embodiment of the present invention. Memory cell 300 is shown containing clock circuitry 310, master latch 350 and slave latch 360. Each component is described in further detail below.

Clock circuitry 310 contains NOR gates 313 and 316, and inverters 314, 315 and 317. A clock signal (source clock) GCLK on path 311, and scan-enable signal SCANEN on path 312 are provided as inputs to clock circuitry 310. As may be seen from FIG. 3, when SCANEN is valid (as it would be during a scan operation) and at a logic 1, outputs CLKZ (319) and CLKBB (318) are frozen (do not toggle and thus non-operative), and outputs SCLKBB (320) and SCLKZ (321) toggle (operative) in response to GCLK (311).

When SCANEN is invalid (as it would be during normal operation) and at a logic 0, outputs CLKZ (319) and CLKBB (318) toggle in response to GCLK (311), while outputs SCLKBB (320) and SCLKZ (321) are frozen. Thus CLKBB/CLKZ (318/319) are operative only during a functional mode operation, while SCLKBB/SCLKZ (320/321) are operative only during a scan test. GCLK (311) and SCANEN (312) may be provided by circuitry contained in an IC in which memory cell 300 is used or from a source external to the IC.

Master latch 350 contains inverters 333, 334 and 339, passgates (switches) 335 and 336, and back-to-back (output of the first inverter being connected to the input of the second inverter, and output of the second inverter being connected to the input of the first inverter) connected tri-state inverters 337 and 338. Tri-state inverters 337 and 338 in combination store either input D (path 331) or input SI (332) and effectively provide the stored output on path 345, as described below.

Slave latch 360 contains inverters 361, 365 and 366, pass-gates (switches) 367, 368, 341 and 362, NOR gate 363 and NAND gate 364. Inverters 365 and 366 in combination store the output (path 345) of master latch 350, or input SI (332) and effectively provide either the stored functional data input D (331) on path 385 (QB) (when signal 322 is a logic 1), or the stored scan input SI (332) on path 386 (SD) (when SCANEN 312 is a logic 1).

It should be appreciated that master latch 350 and slave latch 360 together form a flip-flop, thereby representing a storage element (which stores a data bit). However, each of the latches may also be viewed as a storage element since the structures are also designed to store bit values.

Passgates (transmission gates) 335 and 336 operate as switches to connect functional data D and scan data SI to the storage element. The operation of memory cell 300 is described below with respect to FIGS. 3B, 3C, 3D and 3E. In particular, FIGS. 3B and 3C illustrate the operation during functional mode and FIGS. 3D and 3E illustrate the operation during scan mode, as described below.

Functional Mode:

In functional mode SCANEN (312) is invalid (logic 0 in the embodiment of FIG. 3A), and only CLKBB (318) and CLKZ (319) toggle (are operative) in response to clock GCLK (311). SCLKZ (321) is frozen at logic 0, while SCLKBB (320) is frozen at logic 1. Passgates 336 and 367 are OFF while passgate 362 and tri-state inverter 337 are ON. Scan data output SD (386) is invalid and remains at a value of logic 0 in functional mode.

Figure 3B:
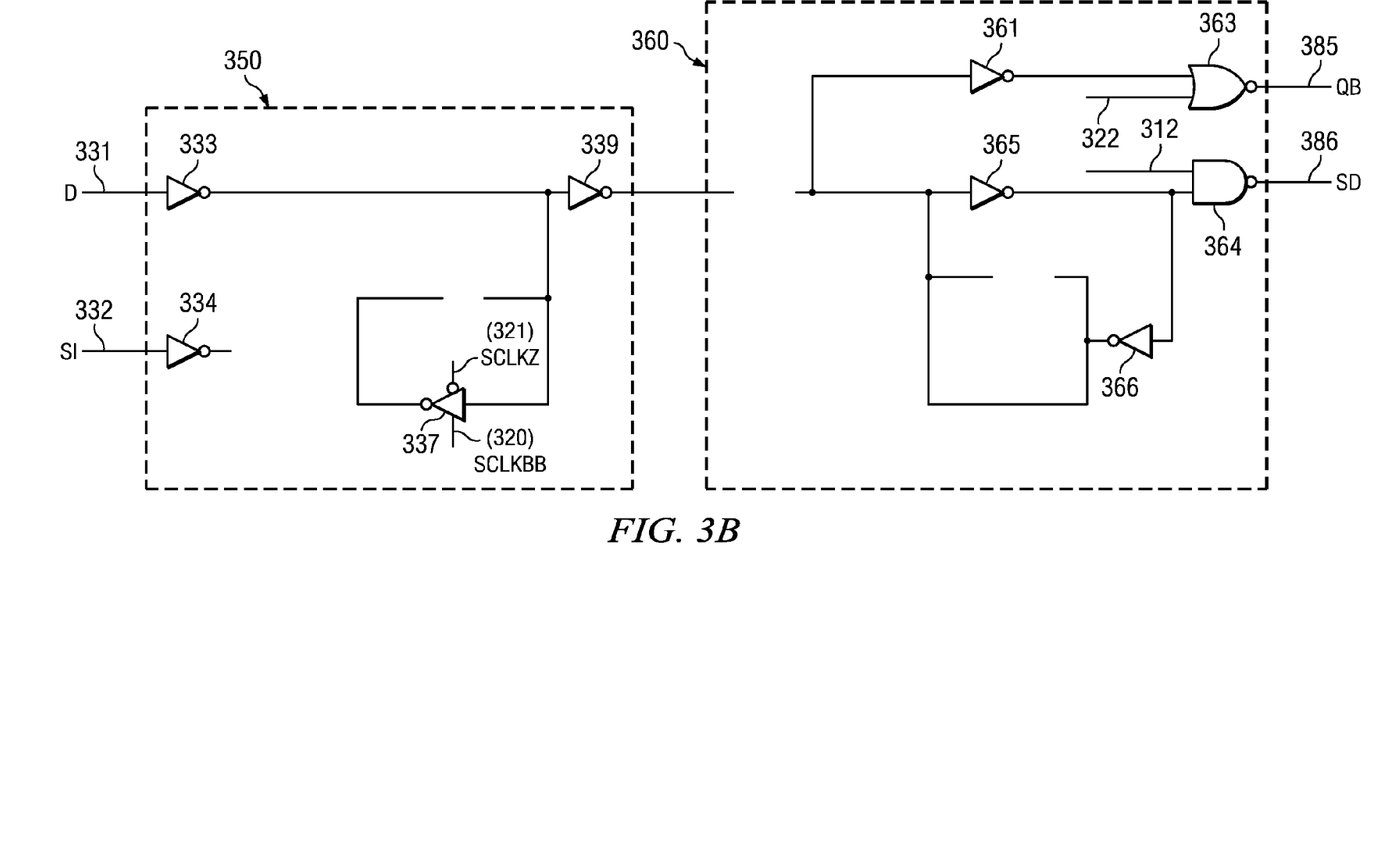
FIG. 3B is a circuit diagram showing the connectivity in the master latch and slave latch portions of a memory cell when GCLK is a logic 0 in functional mode.
Figure 3C:
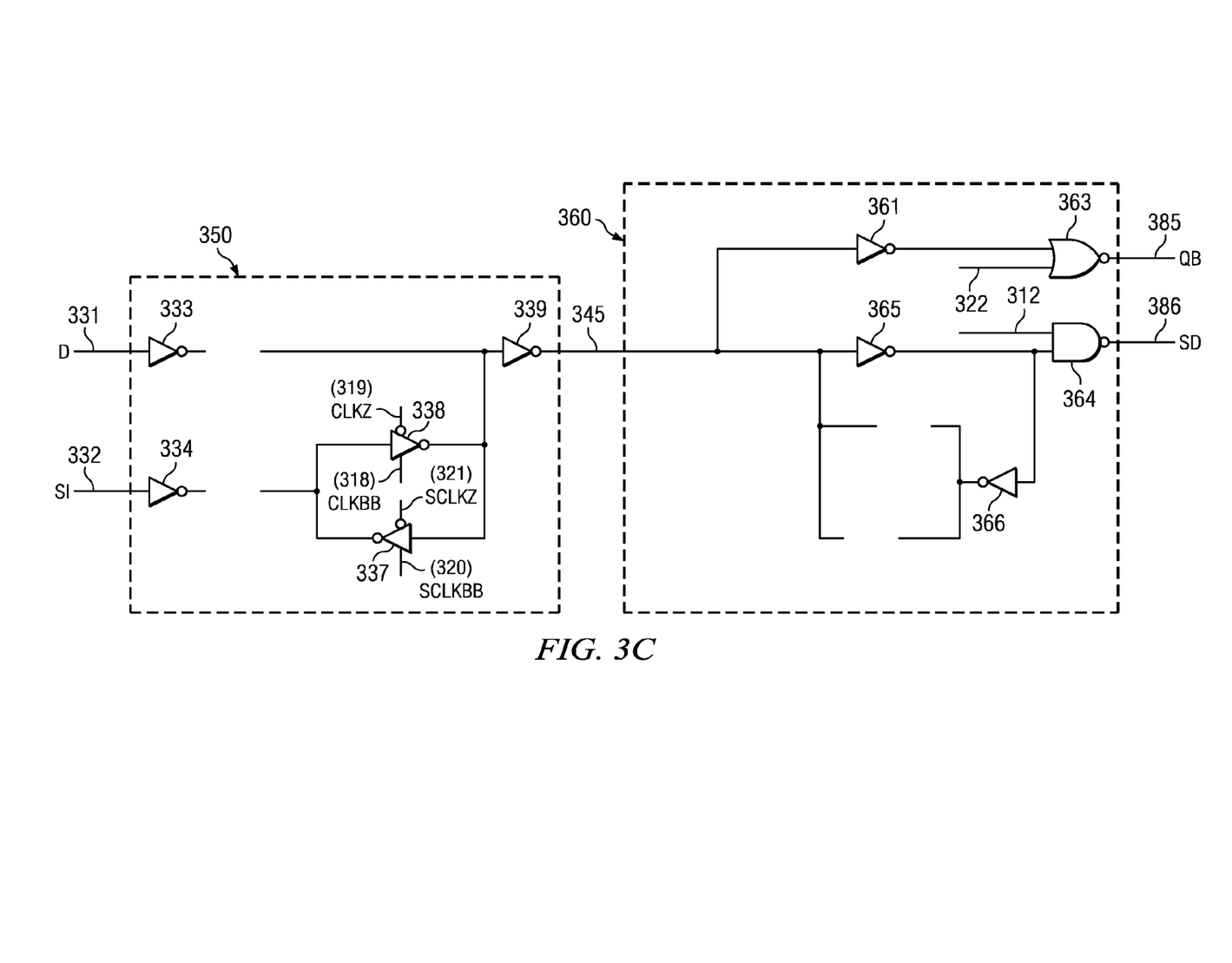
FIG. 3C is a circuit diagram showing the connectivity in the master latch and slave latch portions of a memory cell when GCLK is at logic 1 in functional mode.
Figure 3D:
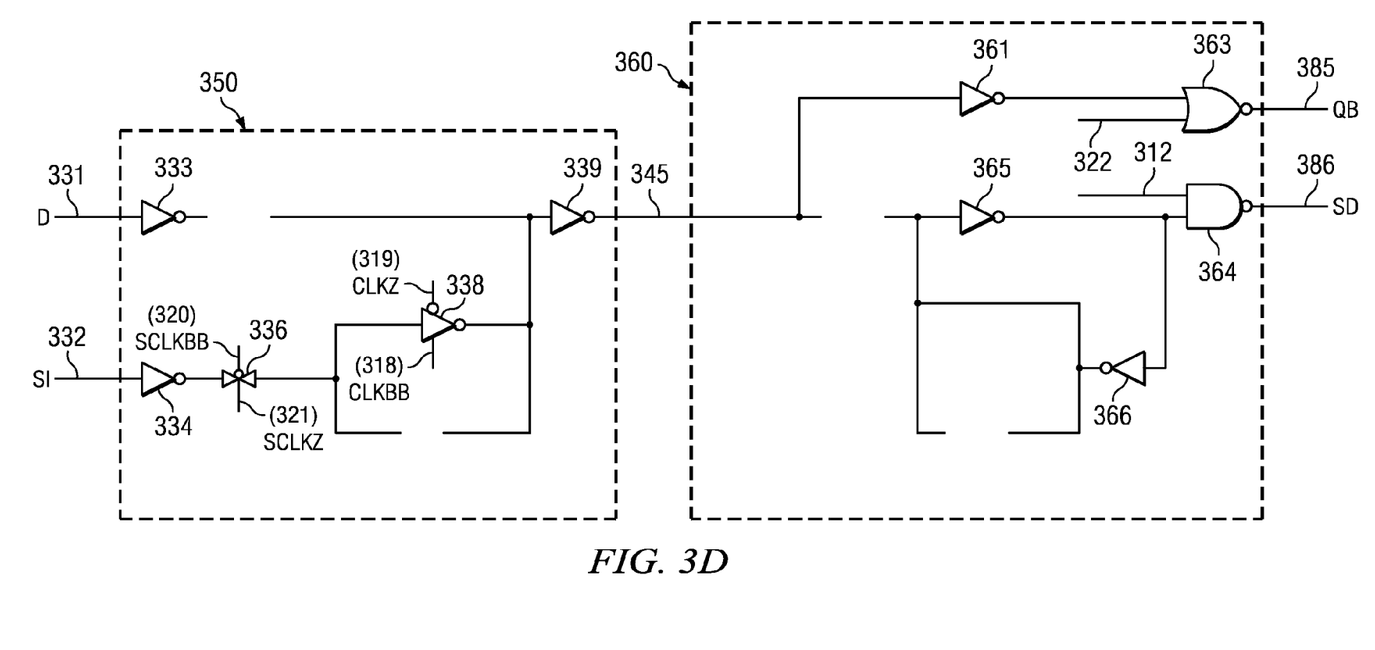
FIG. 3D is a circuit diagram showing the connectivity in the master latch and slave latch portions of a memory cell when GCLK is at logic 0 in scan mode.
Figure 3E:
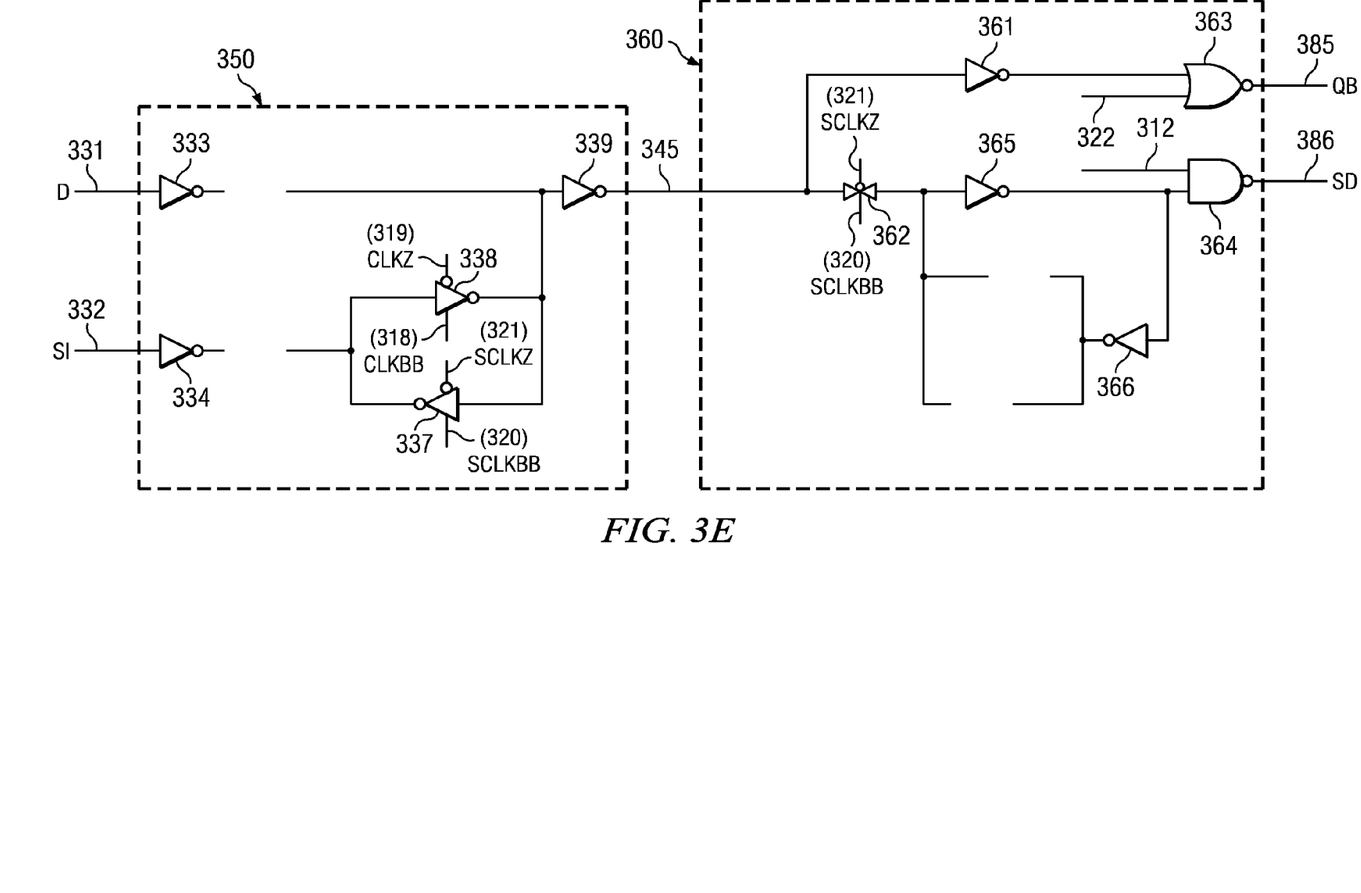
FIG. 3E is a circuit diagram showing the connectivity in the master latch and slave latch portions of the memory cell of FIG. 3A when GCLK is at logic 1 in scan mode.

FIG. 3B shows the connectivity in the master latch 350 and slave latch 360 portions of memory cell 300 of FIG. 3A when GCLK is at logic 0 in functional mode. When GLCK is at logic 0, CLKZ is at logic 1 and CLKBB is at logic 0. Consequently, as shown in FIG. 3B, passgates 335 and 368 are ON, while passgate 341 and tri-state inverter 338 are OFF (shown as no connection). Thus, slave latch 360 provides the functional data (D) value stored in the previous clock cycle. Output QB on path 385 is the stored value of the D input 331 latched during the previous clock cycle. An inverse value of the D input is available at the output of tri-state inverter 337.

FIG. 3C shows the connectivity in the master latch 350 and slave latch 360 portions of memory cell 300 of FIG. 3A when GCLK is at logic 1 in functional mode. When GLCK is at logic 1, CLKZ is at logic 0 and CLKBB is at logic 1. Consequently, as shown in FIG. 3C passgates 335 and 368 are OFF, while passgate 341 and tri-state inverter 338 are ON. Master latch 350 stores (latches) the value of the D input since the back-to-back connection of tri-state inverters 338 and 337 is now completed.

It may be noted that tri-state inverter 338 turns ON earlier than passgate 335 turns OFF due to the delay in inverter 314 (FIG. 3A). Therefore, the D input is reliably latched. Further, passgate 368 turns OFF at the same time as tri-state inverter 338 turns ON preventing signal contention on path 345. The output of master latch 350 (and thus the D input) is provided as QB (path 385). Data D is also available at the output of inverter 366.

When GCLK transitions from a logic 1 to a logic 0, the output of master latch 350 is transferred to slave latch 360 since passgate 368 would turn ON completing the back-to back connection of inverters 365 and 366.

Scan Mode:

In scan mode SCANEN is valid (logic 1 in the embodiment of FIG. 3A), and only SCLKBB and SCLKZ toggle in response to clock GCLK (311). CLKZ is frozen at logic 0, while CLKBB is frozen at logic 1. Passgates 335 and 368 are OFF while passgate 341 and tri-state inverter 338 are ON. Functional data output QB(385) is invalid and remains at a value of logic 0 in scan mode.

FIG. 3D shows the connectivity in the master latch 350 and slave latch 360 portions of memory cell 300 of FIG. 3A when GCLK is a logic 0 in scan mode. When GLCK is at logic 0, SCLKZ is at logic 1 and SCLKBB is at logic 0. Consequently, as shown in FIG. 3D, passgates 336 and 367 are ON, while passgate 362 and tri-state inverter 337 are OFF(shown as no connection). Thus, slave latch 360 provides the scan data (SI) value stored in the previous clock cycle. Output QB on path 385 is the stored value of the D input 331 latched during the previous clock cycle. The SI input is available at the output of tri-state inverter 338.

FIG. 3E shows the connectivity in the master latch 350 and slave latch 360 portions of memory cell 300 of FIG. 3A when GCLK is at logic 1 in scan mode. When GLCK is at logic 1, SCLKZ is at logic 0 and SCLKBB is at logic 1. Consequently, as shown in FIG. 3E passgates 336 and 367 are OFF, while passgate 362 and tri-state inverter 337 are ON. Master latch 350 stores (latches) the value of the SI input since the back-to-back connection of tri-state inverters 338 and 337 is now completed.

It may be noted that tri-state inverter 337 turns ON earlier than passgate 336 turns OFF due to the delay in inverter 314 (FIG. 3A). Therefore, the SI input is reliably latched. Further, passgate 367 turns OFF at the same time as tri-state inverter 337 turns ON preventing signal contention on path 345. The output of master latch 350 (and thus the Si input) is provided as SD (path 386). Test signal SI is also available at the output of inverter 365.

When GCLK transitions from a logic 1 to a logic 0, the output of master latch 350 is transferred to slave latch 360 since passgate 367 would turn ON completing the back-to back connection of inverters 365 and 366.

As may be appreciated from the foregoing description, separate pairs of clock signals CLKZ/CLKBB and SCLKZ/SCLKBB are generated to store either a functional data (in the case of CLKZ/CLKBB) or a scan test data (in the case of SCLKZ/SCLKBB). It may be noted from FIGS. 3A-3E that no explicit multiplexing circuitry is used as was in the prior memory cell of FIG. 2. Consequently, the delay from the input(D or SI) to output (QB or SD) of memory cell 300 does not suffer the additional delay due to such multiplexing circuitry. Memory cell 300 may thus be used to provide outputs with reduced time delay, while continuing to support scan-based tests.

Memory cell 300 of FIG. 3A requires a relatively larger set-up time requirement for the D input. This is because master latch 350 uses two back-to-back connected tri-state inverters 337 and 338. Due to the internal structure of tri-state inverters 337/338, inputs D/SI must be valid for a greater length of time before the triggering (0 to 1 edge in the embodiment of FIG. 3A) of GCLK thus signifying a longer set-up time. Memory cell 300 may be modified to provide a structure which has smaller set-up time requirements. This is briefly explained below.

5. Reducing Set-Up Time Requirement

Figure 4:
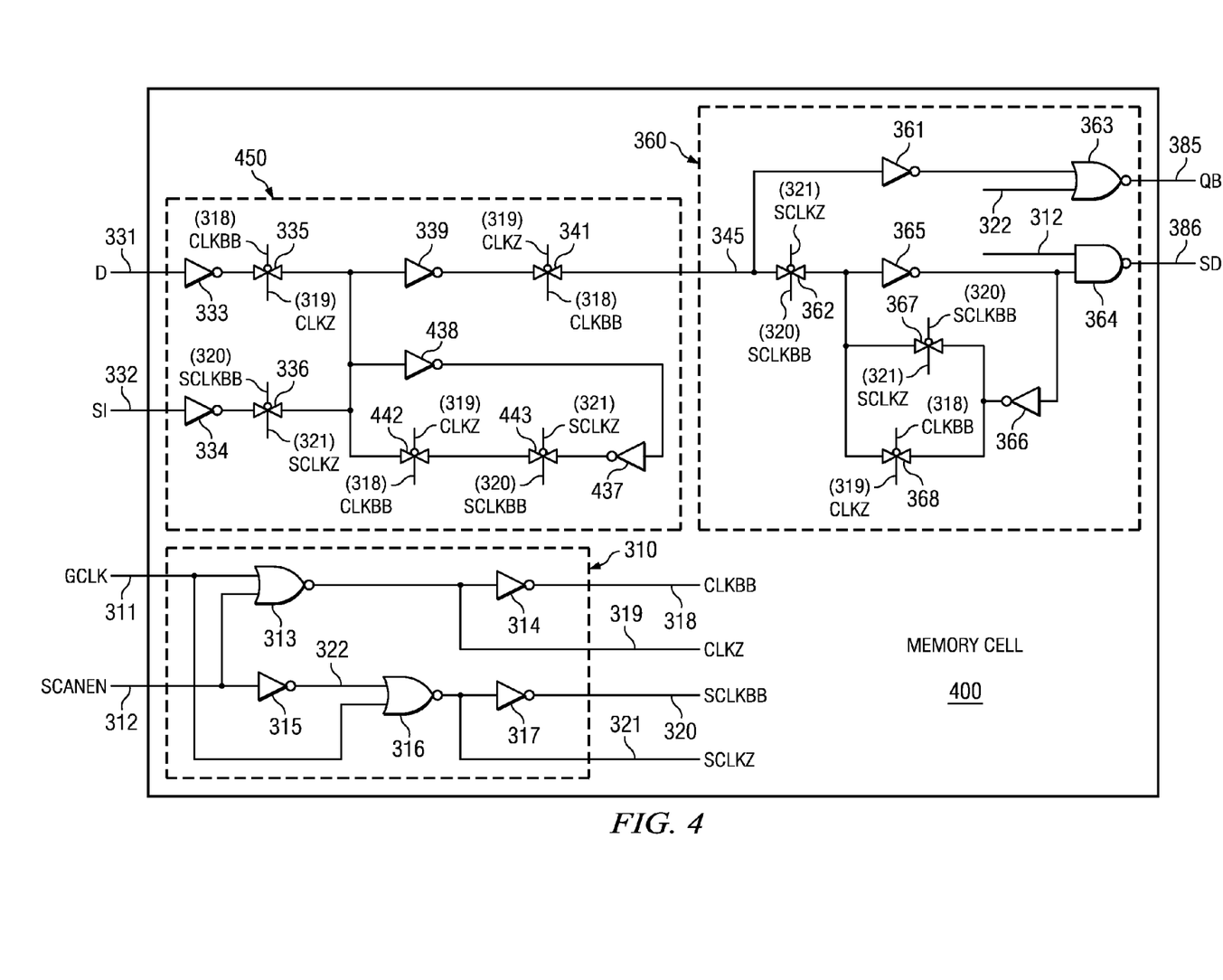
FIG. 4 is a circuit diagram of a memory cell which provides reduced set-up time requirements for inputs in an embodiment of the present invention.

FIG. 4 is a diagram of a memory cell in an alternative embodiment of the present invention. Memory cell 400 is shown containing clock circuitry 310, master latch 450 and slave latch 360. Clock circuitry 310 and slave latch 360 operate as in memory cell 300 of FIG. 3A, and their description is not repeated here in the interest of conciseness.

Master latch 450 contains components same as in master latch 350 except for tri-state inverters 337 and 338 which are shown replaced by inverters 437/438 and passgates 442/443.

Passgates 442 and 443 when activated by clocks CLKZ/CLKBB and SCLKZ/SCLKBB respectively operate to connect inverters 437 and 438 in a back-to-back fashion to store either a D or an SI input. Memory cell 400 operates with similar configurations as described above with respect to FIGS. 3A-3E in various phases, and is not repeated here in the interest of conciseness.

Since inverter 437 does not have to drive inverter 438 directly (contrary to the case in master latch 350 of memory cell 300 of FIG. 3A), the arrangement of components 437, 438, 442 and 443 provides a smaller set-up time requirement for inputs (D/SI) in memory cell 400.

Memory cell 400 of FIG. 4 provides a reduced set-up time requirement. However, the use of a relatively large number of passgates may cause difficulties (congestion) in routing the connections between the various components. The next section briefly describes an alternate embodiment which addresses this issue.

6. Reducing Routing Congestion

Figure 5A:
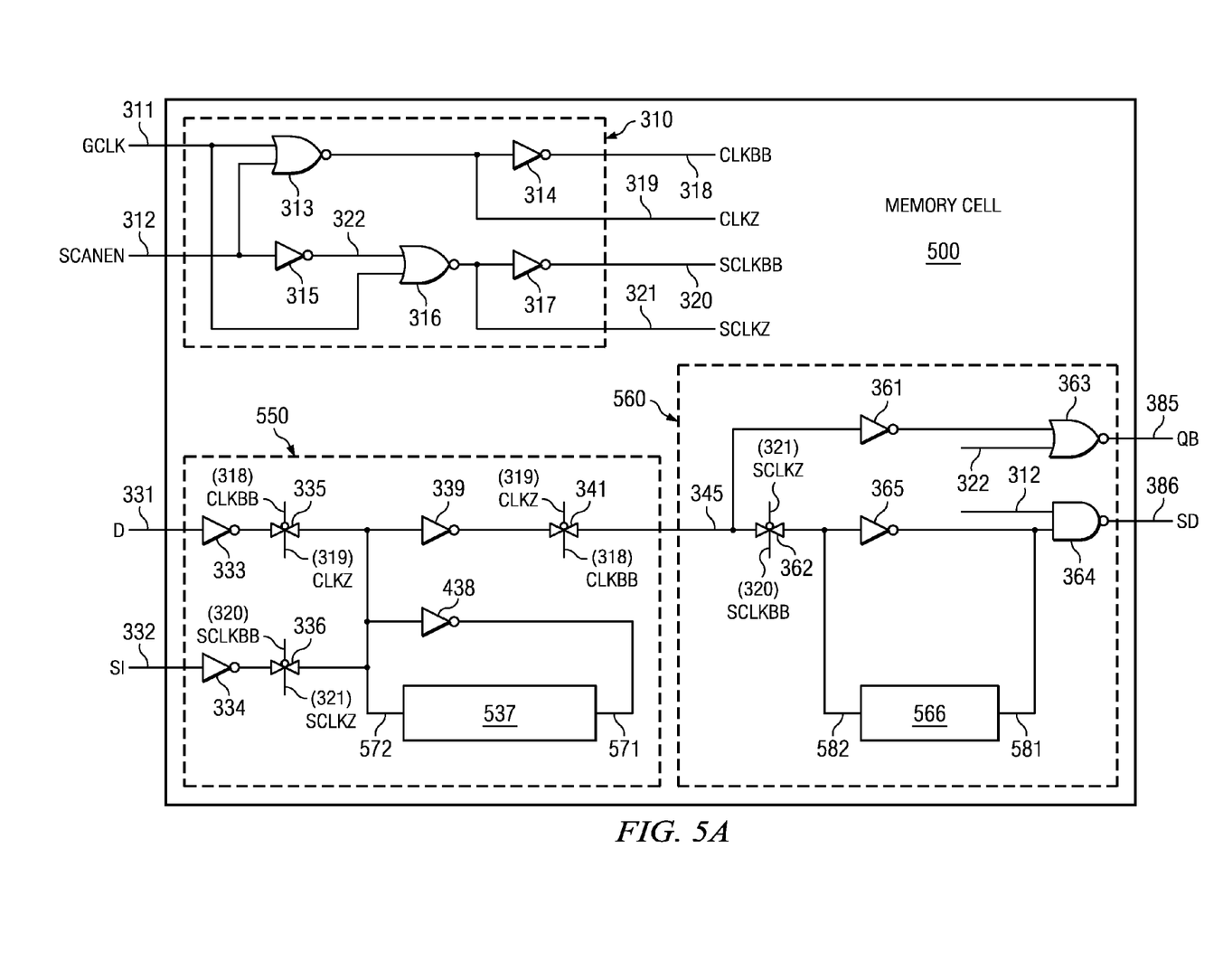
FIG. 5A is a circuit diagram of a memory cell which provides reduced routing congestion in an alternative embodiment of the present invention.

FIG. 5A is a diagram of a memory cell in another embodiment of the present invention. Memory cell 500 is shown containing clock circuitry 310, master latch 550 and slave latch 560. Clock circuitry 310 operates as in memory cell 300 of FIG. 3A and its description is not repeated here in the interest of conciseness.

Master latch 550 contains components same as master latch 450 in memory cell 400 (FIG. 4) except for components 442, 443 and 437 which are shown replaced by pass-transistor 537. Pass transistor 537 containing three PMOS transistors and three NMOS transistors as shown in FIG. 5B.

Slave latch 560 contains components same as slave latch 360 in memory cell 400 (FIG. 4) except for components 366, 367 and 368, which are shown replaced by pass-transistor 566. Pass transistor 566 is shown containing three PMOS transistors and three NMOS transistors as shown in FIG. 5C. Memory cell 500 operates with similar configurations as described above with respect to FIGS. 3A-3E in various phases.

Figure 5B:
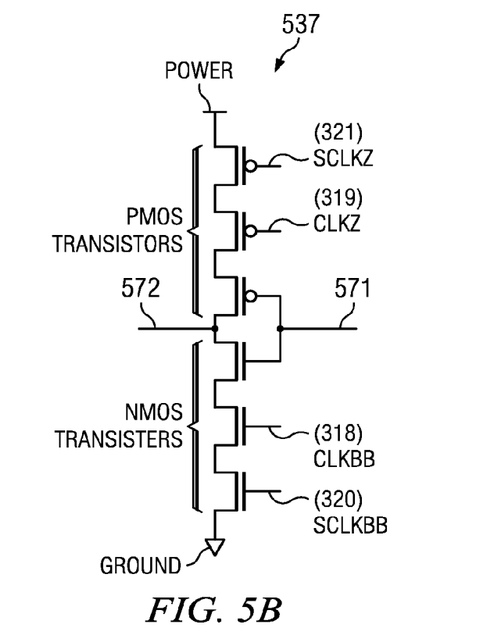
FIGS. 5B and 5C are circuit diagrams showing the internal details of pass-transistors used in the embodiment of FIG. 5A.
Figure 5C:
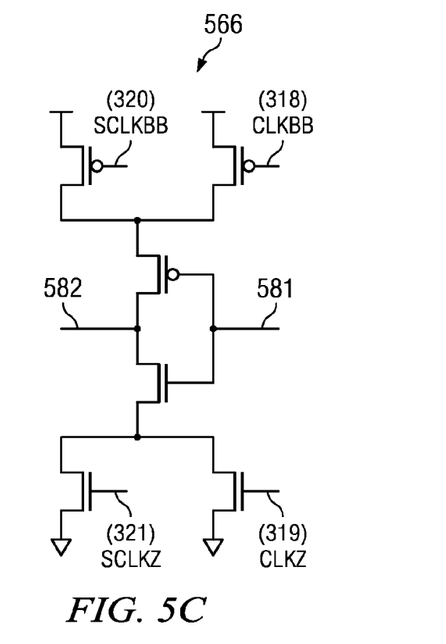

The internal details of pass-transistors 537 and 566 including the signal/power/ground connections are shown in FIGS. 5B and 5C respectively. Tri-state control logic required in the master latch (slave latch) which was previously (FIGS. 3A and 4) implemented separately on each component in the back-to-back inverter arrangement of master (slave) latch is implemented on a single pass transistor 537 (566) with multiple tri-state controls provided by SCLKZ, SCLKBB, CLKZ and CLKBB.

Figure 5D:
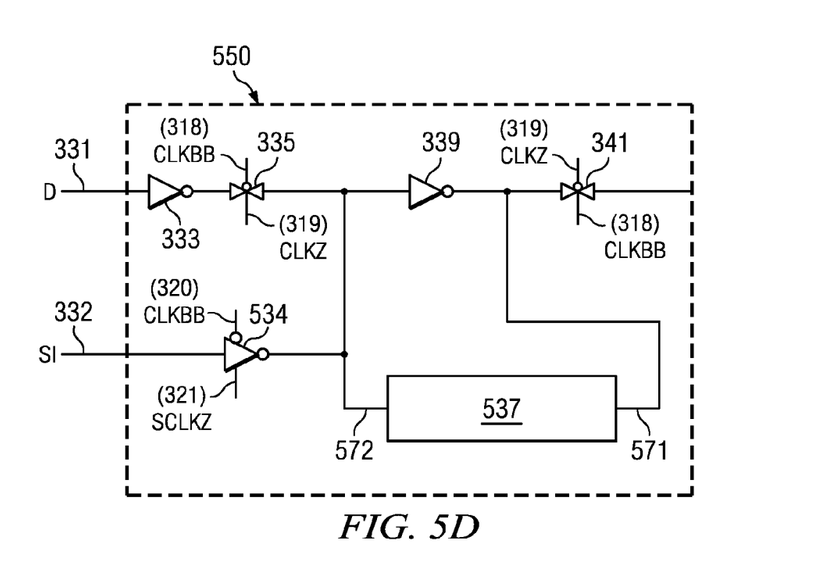
FIG. 5D is a circuit diagram of a modified master latch in another embodiment of the present invention.

As a result, signal routing congestion that may be present in the case of memory cell 400 may be reduced. Further, as shown in FIG. 5D, component count reduction may be obtained by including inverter 339 in the back-to-back connection of master latch 550, removing inverter 438, and replacing inverter 334 and passgate 336 by a single tri-state inverter 534.

Thus, it may be appreciated that various structures of a memory cell according to corresponding aspects of the present invention permit additional logic functionality to be provided (added) without additional impact on the set-up requirements for the input signal(s). Thus, logic functions such as NOR, NAND, etc., may be provided by the additional circuitry to the storage element, and without substantially affecting the signal delay time (and hence set-up time).

Figure 6:
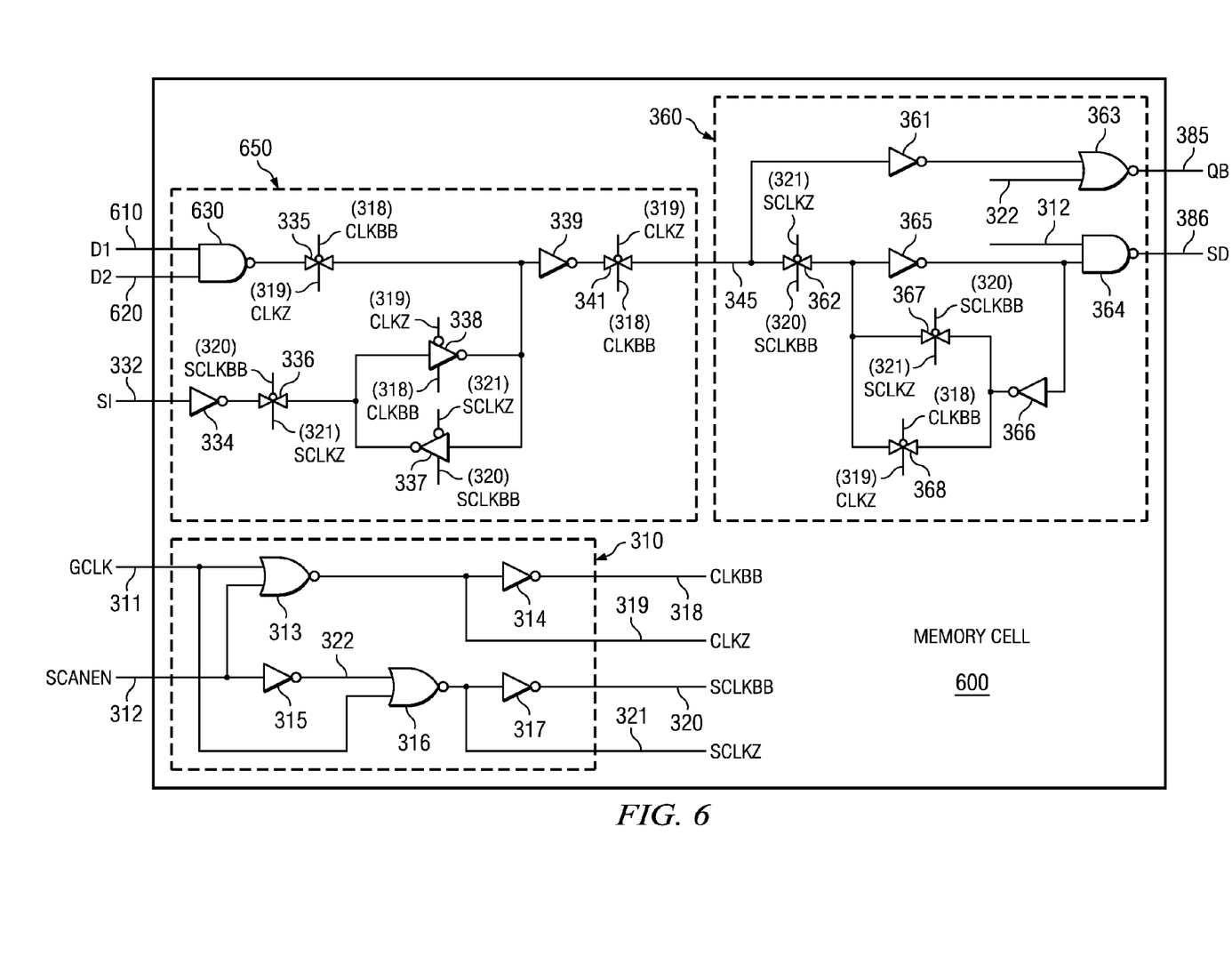
FIG. 6 is a circuit diagram of a memory cell showing its ability to incorporate additional logic in another embodiment of the present invention.

A memory cell 600 providing a NAND functionality is shown in FIG. 6. The circuit of FIG. 6 is similar to that of FIG. 3A, except that inverter 333 is replaced by a NAND gate 630. Thus, an output QB (385) which is the NANDed result of inputs D1 (610) and D2(620) may be stored in memory cell 600.

A memory cell designed according to aspects of the present invention may be incorporated in many devices/components. The description is continued with an example device as described next.

7. Device

Figure 7:
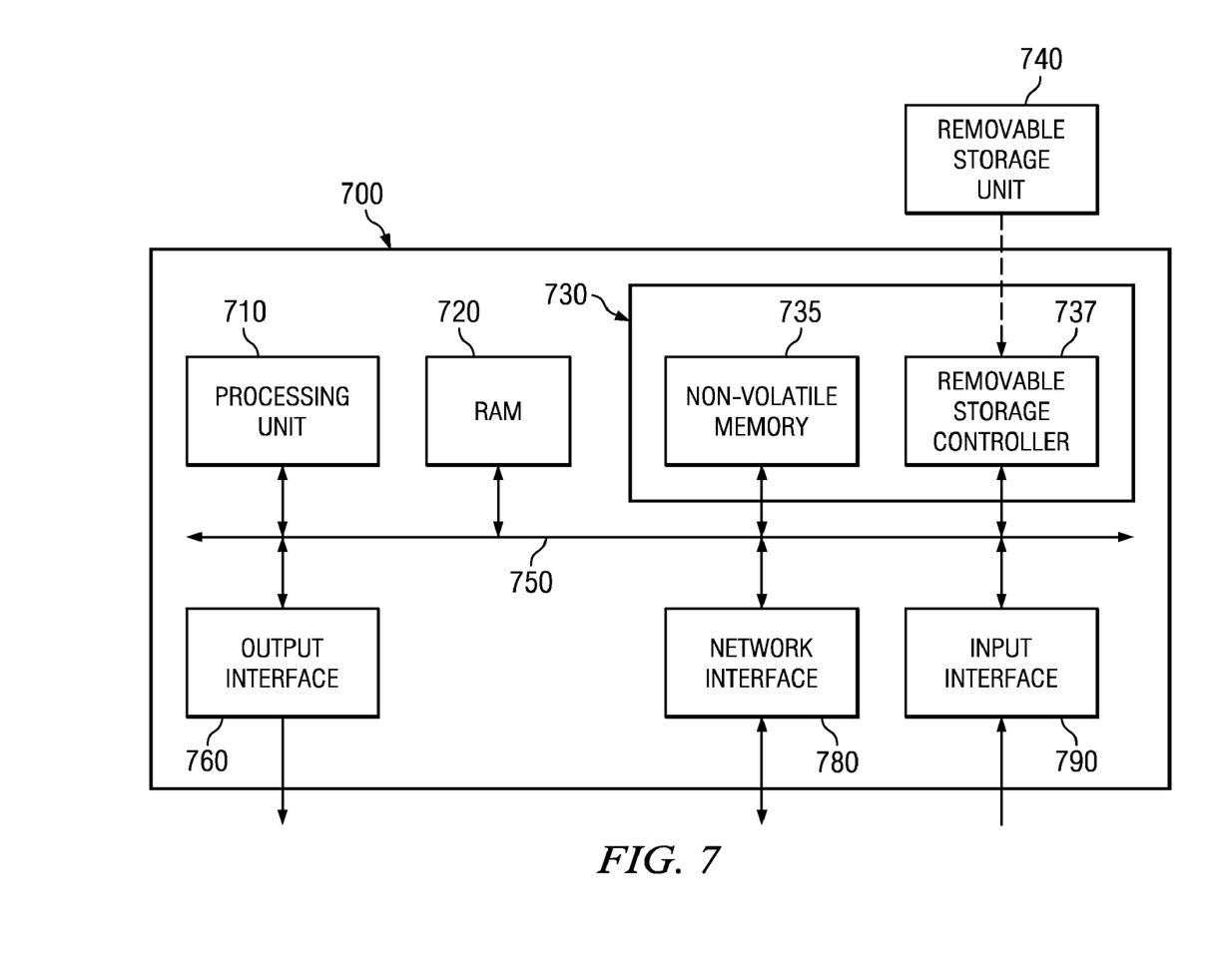
FIG. 7 is a block diagram illustrating the details of an example device containing a multiplier unit according to the present invention in one embodiment.

FIG. 7 is a block diagram illustrating the details of an example device 700 containing a multiplier unit according to the present invention in one embodiment. Device 700 is shown containing processing unit 710, random access memory (RAM) 720, storage 730, output interface 760, network interface 780 and input interface 790. Each component is described in further detail below.

Output interface 760 provides output signals (e.g., display signals to a display unit, not shown) which can form the basis for a suitable user interface. Input interface 790 (e.g., interface with a key-board and/or mouse, not shown) enables a user to provide any necessary inputs to device 700.

Network interface 780 enables device 700 to send and receive data on communication networks. Network interface 780, output interface 760 and input interface 790 can be implemented in a known way.

RAM 720 and storage 730, may together be referred to as a memory. RAM 720 receives instructions and data on path 750 from storage 730, and provides the instructions to processing unit 710 for execution.

Storage 730 may contain units such as non-volatile memory 735 (for example, flash/hard drive) and removable storage controller 737. Storage 730 may store the software instructions and data, which enable device 700 to provide several features in accordance with the present invention.

Some or all of the data and instructions may be provided on removable storage unit 740, and the data and instructions may be read and provided by removable storage controller 737 to processing unit 710. Floppy drive, magnetic tape drive, CD-ROM drive, DVD Drive, Flash memory, removable memory chip (PCMCIA Card, EPROM) are examples of such removable storage controller 737.

Processing unit 710 may contain one or more processors. Some of the processors can be general purpose processors which execute instructions provided from RAM 720. Some can be special purpose processors adapted for specific tasks. The special purpose processors may also be provided instructions from RAM 720. In general processing unit 710 reads sequences of instructions from various types of memory medium (including RAM 720, storage 730 and removable storage unit 740), and executes the instructions.

All components shown in FIG. 7 may contain memory (storage) cells provided in accordance with the present invention which may be used to store data during functional/evaluation mode operation of the corresponding components, or a scan test value during a scan test operation (usually performed after fabrication).

Implementations in other environments are also contemplated to be within the scope and spirit of several aspects of the present invention.

8. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A memory cell supporting a functional mode and a scan mode, said memory cell being designed to receive and store a functional input in said functional mode, said memory cell being designed to receive and store a scan input in said scan mode, said memory cell comprising:
   a master latch comprising:
      a first switch receiving said functional input and a first clock signal as inputs, said first switch providing said functional input when said first clock signal is operative, wherein said first clock signal is operative in said functional mode and non-operative otherwise; and
      a second switch receiving said scan input and a second clock signal as inputs, said second switch providing said scan input when said second clock signal is operative, said second clock signal being operative in said scan mode and non-operative otherwise;
   a slave latch comprising:
      a third switch coupled to the master latch;
      a first inverter and a second inverter, a fourth switch and a fifth switch, wherein said first inverter and said second inverter are connected back-to-back between the third switch and a first node if either said fourth switch or said fifth switch is in an ON state;
      a third inverter, wherein the third switch is coupled between said first node and said third inverter;
      a NOR gate receiving the output of said third inverter on one input, and a inverse of a scan enable signal on another input, and wherein the output terminal of said NOR gate provides a stored value of said functional input when said scan enable signal is at a logic zero; and
      a NAND gate coupled to said first node on one input and said scan enable signal on another input, wherein the output terminal of said NAND gate provides a stored value of said scan input when said scan enable signal is at a logic one.

2. A memory cell supporting a functional mode and a scan mode, the memory cell comprising:
   one master latch comprising:
      a first switch receiving said functional input and a first clock signal as inputs, said first switch providing said functional input when said first clock signal is operative, wherein said first clock signal is operative in said functional mode and non-operative otherwise; and
      a second switch receiving said scan input and a second clock signal as inputs, said second switch providing said scan input when said second clock signal is operative, said second clock signal being operative in said scan mode and non-operative otherwise;
   one slave latch comprising:
      a third switch coupled to the master latch;
      a first inverter and a second inverter, a fourth switch and a fifth switch, wherein said first inverter and said second inverter are connected back-to-back between the third switch and a first node if either said fourth switch or said fifth switch is in an ON state,
   wherein said master latch comprises:
      a third inverter and a fourth inverter;
      a sixth switch and a seventh switch coupled in series between said third inverter and said fourth inverter such that said third inverter and said fourth inverter are connected back-to-back between a second node and a third node if both said sixth switch and said seventh switch are in an ON state,
      said first switch being provided between said second node and a first path on which said functional input is received, said first switch passing said functional input to said second node when said first clock signal is operative,
      said second switch is provided between said third node and a second path on which said scan input is received, said second switch passing said scan input to said third node when said second clock signal is operative.

3. A device comprising:
   a processor processing a digital data; and
   a memory unit providing said digital data, said memory unit comprising a plurality of memory cells including a first memory cell and a second memory cell, wherein an output of at least said first memory cell is coupled to an input of said second memory cell, each of said first memory cell and second memory cell supporting a functional mode and a scan mode, each of said first memory cell and second memory cell being designed to receive and store a functional input in said functional mode, and being designed to receive and store a scan input in said scan mode, each of said first memory cell and second memory cell comprising:
      a first switch receiving said functional input and a first clock signal as inputs, said first switch providing said functional input when said first clock signal is operative, wherein said first clock signal is operative in said functional mode and non-operative otherwise; and
      one master latch comprising:
         a first switch receiving said functional input and a first clock signal as inputs, said first switch providing said functional input when said first clock signal is operative, wherein said first clock signal is operative in said functional mode and non-operative otherwise; and
         a second switch receiving said scan input and a second clock signal as inputs, said second switch providing said scan input when said second clock signal is operative, said second clock signal being operative in said scan mode and non-operative otherwise;
      one slave latch comprising:

a third switch coupled to the master latch; and
a first inverter and a second inverter, a fourth switch and a fifth switch, wherein said first inverter and said second inverter are connected back-to-back between the third switch and a first node if either said fourth switch or said fifth switch is in an ON state.
wherein said slave latch further comprises:
a third inverter, wherein the third switch is coupled between said first node and said third inverter:
a NOR gate receiving the output of said third inverter on one input, and a inverse of a scan enable signal on another input, and wherein the output terminal of said NOR gate provides a stored value of said functional input when said scan enable signal is at a logic zero; and
a NAND gate coupled to said first node on one input and said scan enable signal on another input, wherein the output terminal of said NAND gate provides a stored value of said scan input when said scan enable signal is at a logic one.

4. A device comprising:
a processor processing a digital data; and
a memory unit providing said digital data, said memory unit comprising a plurality of memory cells including a first memory cell and a second memory cell, wherein an output of at least said first memory cell is coupled to an input of said second memory cell, each of said first memory cell and second memory cell supporting a functional mode and a scan mode, each of said first memory cell and second memory cell being designed to receive and store a functional input in said functional mode, and being designed to receive and store a scan input in said scan mode, each of said first memory cell and second memory cell comprising:
a master latch comprising:

a first switch receiving said functional input and a first clock signal as inputs, said first switch providing said functional input when said first clock signal is operative, wherein said first clock signal is operative in said functional mode and non-operative otherwise; and
a second switch receiving said scan input and a second clock signal as inputs, said second switch providing said scan input when said second clock signal is operative, said second clock signal being operative in said scan mode and non-operative otherwise;
a master latch comprising:
a third switch coupled to the master latch;
a first inverter and a second inverter, a fourth switch and a fifth switch, wherein said first inverter and said second inverter are connected back-to-back between the third switch and a first node if either said fourth switch or said fifth switch is in an ON state;
a third inverter and a fourth inverter; and
a sixth switch and a seventh switch coupled in series between said third inverter and said fourth inverter such that said third inverter and said fourth inverter are connected back-to-back between a second node and a third node if both said sixth switch and said seventh switch are in an ON state,
said first switch being provided between said second node and a first path on which said functional input is received, said first switch passing said functional input to said second node when said first clock signal is operative,
said second switch is provided between said third node and a second path on which said scan input is received, said second switch passing said scan input to said third node when said second clock signal is operative.

* * * * *